(12) United States Patent
Huang

(10) Patent No.: US 8,232,842 B1
(45) Date of Patent: Jul. 31, 2012

(54) OUTPUT BUFFER

(75) Inventor: Hung-Yu Huang, Tainan (TW)

(73) Assignee: Himax Technologies Limited, Tainan (TW)

(*) Notice: Subject to any disclaimer, the term of this patent is extended or adjusted under 35 U.S.C. 154(b) by 0 days.

(21) Appl. No.: 13/045,925

(22) Filed: Mar. 11, 2011

(51) Int. Cl.
*H03F 3/18* (2006.01)

(52) U.S. Cl. ........................ 330/264; 330/265

(58) Field of Classification Search .............. 330/255, 330/260, 261, 264, 265, 267
See application file for complete search history.

(56) References Cited

U.S. PATENT DOCUMENTS

| | | | |
|---|---|---|---|
| 5,585,763 A * | 12/1996 | Navabi et al. | 330/265 |
| 6,717,470 B1 * | 4/2004 | Bowers | 330/264 |
| 7,075,370 B2 * | 7/2006 | Youngblood | 330/264 |
| 7,265,593 B2 | 9/2007 | Sung | |
| 7,274,254 B2 | 9/2007 | Hsieh | |
| 7,969,217 B2 * | 6/2011 | Huang et al. | 327/108 |

* cited by examiner

*Primary Examiner* — Khanh V Nguyen
(74) *Attorney, Agent, or Firm* — J.C. Patents

(57) ABSTRACT

An output buffer including a differential amplifier, a first and a second output stage, and a first and a second control stage is provided. The differential amplifier receives an input and a feedback signal and accordingly adjusts the level of the first and second control signals. The first control stage determines to provide a first current to an output terminal of the output buffer according to the level of the first and second control signals. The first control stage is biased under a high voltage and outputs one of the first control signal and the high voltage. The second control stage is biased under the low voltage and outputs one of the second control signal and the low voltage. The second output stage determines to provide a second current to the output terminal of the output buffer according to the signal generated by the first and second control stages.

7 Claims, 1 Drawing Sheet

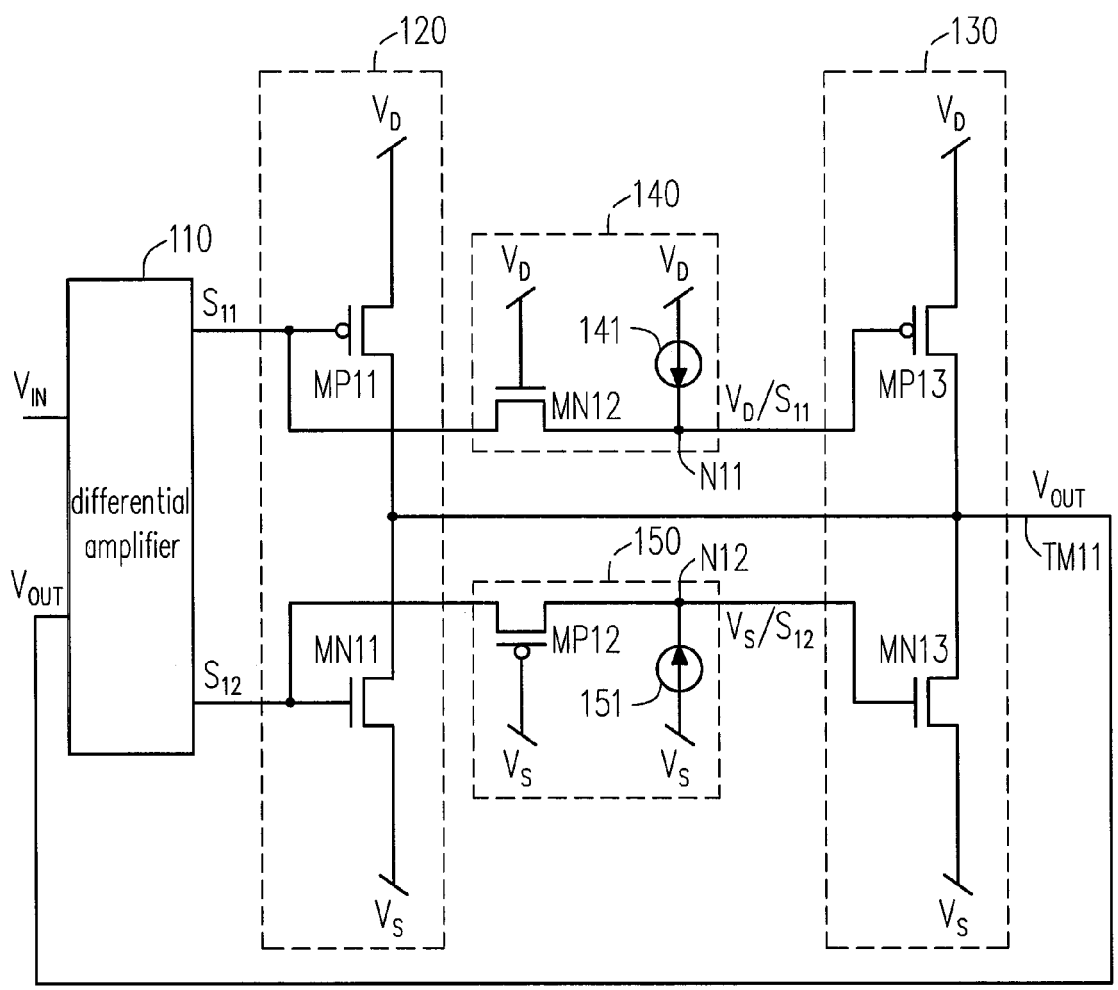

OUTPUT BUFFER

BACKGROUND OF THE INVENTION

1. Field of the Invention

The invention relates generally to an output buffer, and more particularly to an output buffer having two output stages.

2. Description of Related Art

The source driver is an important element in a driving system of a display apparatus, which is used for providing a driving voltage to a pixel electrode corresponding to an enabled scan line. Due to a panel loading effect and manufacturing variables, the driving voltage provided to the pixel electrode is usually less than ideal. Therefore, the source driver needs an output buffer to manipulate the driving voltage to a specific voltage level. Moreover, as applications of large size panels and frequency multiplying techniques emerge, the output buffer is required to bear an enormous load. Accordingly, for rapid driving the source driver needs to utilize an output buffer having a high slew rate or a high driving ability.

In order to increase the slew rate of the output buffer, U.S. Pat. No. 7,265,593 discloses a "Slew rate enhancement circuit via dynamic output stage for adjusting gamma curve". The output stage disclosed in this patent includes an amplifier, a main output stage, a monitoring control device, and an auxiliary output stage. The main output stage is controlled by the amplifier, and accordingly the main output stage generates a boost signal and a pull signal. The monitoring control device is used for weakening the boost signal and the pull signal. The weakened boost signal and the pull signal are used to control the auxiliary output stage. Accordingly, when the input signal is not equal to the output signal, not only the main output stage but also the auxiliary output stage can provide a current to the load. However, when the input signal is equal to the output signal, the monitoring control device must continually turn off the auxiliary output stage. In other words, under a stable system, the monitoring control device must consume a specific amount of static current to turn off the auxiliary output stage, thereby increasing the power consumption of the output buffer.

In addition, U.S. Pat. No. 7,274,254 discloses a "Device and method for enhancing output current driving". The output stage disclosed in this patent includes an operational amplifier, an output stage, an auxiliary output device, and a monitor device. The output stage is controlled by the operational amplifier. The monitor device is for monitoring the input status of the operational amplifier, thereby controlling the auxiliary output device. Accordingly, when the input signal is not equal to the output signal, the auxiliary output device can increase the driving ability of the output device. However, when the input signal is the same as the output signal, the monitor device must continually consume a static current to continually turn off the auxiliary output device. In other words, the monitor device not only increases the power consumption of the overall system, but the addition of the monitor device also enlarges the layout area of the system.

SUMMARY OF THE INVENTION

Accordingly, the invention is directed to an output buffer employing a first control stage and a second control stage to control a second output stage complementing a first output stage. Moreover, the first control stage and the second stage do not consume static current when the output buffer is in a static state, so as to effectively lower the power consumption of the output buffer.

An embodiment of the invention provides an output buffer, including a differential amplifier, a first output stage, a first control stage, a second control stage, and a second output stage. The differential amplifier receives an input signal and a feedback signal from an output terminal of the output buffer and accordingly adjusts a level of a first control signal and a second control signal. The first output stage and the second output stage are biased between a high voltage and a low voltage. Moreover, the first output stage judges whether to provide a first current to the output terminal of the output buffer according to the level of the first control signal and the second control signal. The first control stage is biased under the high voltage and outputs one of the first control signal and the high voltage according to the level of the first control signal. The second control stage is biased under the low voltage and outputs one of the second control signal and the low voltage according to the level of the second control signal. The second output stage judges whether to provide a second current to the output terminal of the output buffer according to the signal generated by the first control stage and the second control stage.

According to an embodiment of the invention, the first output stage includes a first P channel transistor and a first N channel transistor. The first P channel transistor has a source receiving the high voltage, a gate receiving the first control signal, and a drain electrically connected to the output terminal of the output buffer. Moreover, the first N channel transistor has a drain electrically connected to the drain of the first P channel transistor, a gate receiving the second control signal, and a source receiving the low voltage. When the input signal is not equal to the feedback signal, one of the first P channel transistor and the first N channel transistor is turned on. When the input signal is equal to the feedback signal, the first P channel transistor and the first N channel transistor are both turned on.

According to an embodiment of the invention, the first control stage includes a second N channel transistor and a first current source. The second N channel transistor has a drain/source receiving the first control signal, and a gate receiving the high voltage. The first current source has a first terminal receiving the high voltage, and a second terminal electrically connected to a source/drain of the second N channel transistor and the second output stage. When the input signal is greater than the feedback signal, the first P channel transistor and the second N channel transistor are both turned on. When the input signal is equal to the feedback signal, the first P channel transistor and the second N channel transistor are both turned off.

According to an embodiment of the invention, the second output stage includes a second P channel transistor and a second current source. The second P channel transistor has a drain/source receiving the second control signal, and a gate receiving the low voltage. The second current source has a first terminal receiving the low voltage, and a second terminal electrically connected to a source/drain of the second P channel transistor and the second output stage. When the input signal is lower than the feedback signal, the first N channel transistor and the second P channel transistor are both turned on. When the input signal is equal to the feedback signal, the first N channel transistor is turned on, and the second P channel transistor is both turned off.

In summary, an embodiment of the invention employs the second control stage to increase a driving ability of the first output stage, and employs the first control stage and the second control stage to control the second output stage. The first control stage and the second control stage are respectively biased under the high voltage and the low voltage, therefore extra static current is not consumed and the power consumption of the output buffer is effectively lowered.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1 is a schematic circuit diagram of an output buffer according to an embodiment of the invention.

DESCRIPTION OF EMBODIMENTS

FIG. 1 is a schematic circuit diagram of an output buffer according to an embodiment of the invention. Referring to FIG. 1, an output buffer 100 includes a differential amplifier 110, a first output stage 120, a second output stage 130, a first control stage 140, and a second control stage 150. The first output stage 120 and the second output stage 130 are biased between a high voltage $V_D$ and a low voltage $V_S$. The first control stage 140 is biased under high voltage $V_D$, and the second control stage 150 is biased under the low voltage $V_S$.

In more details, the first output stage 120 includes a P channel transistor MP11 and an N channel transistor MN11. The P channel transistor MP11 has a source receiving the high voltage $V_D$, a gate receiving a first control signal $S_{11}$, and a drain electrically connected to an output terminal TM11 of the output buffer 100. The N channel transistor MN11 has a drain electrically connected to the drain of the P channel transistor MP11, a gate receiving a second control signal $S_{12}$, and a source receiving the low voltage $V_S$.

In operation, the differential amplifier 110 receives an input signal $V_{IN}$ and a feedback signal $V_{OUT}$ generated by the output terminal TM11 of the output buffer 100, and accordingly the differential amplifier 110 generates the first control signal $S_{11}$ and the second control signal $S_{12}$. When the input signal $V_{IN}$ is not equal to the feedback signal $V_{OUT}$, one of the P channel transistor MP11 and the N channel transistor MN11 is turned on. Moreover, when the input signal $V_{IN}$ is equal to the feedback signal $V_{OUT}$, the P channel transistor MP11 and the N channel transistor MN11 are under static bias and weakly turned on.

Continuing reference to FIG. 1, the first control stage 140 includes an N channel transistor MN12 and a current source 141, and the second control stage 150 includes a P channel transistor MP12 and a current source 151. The N channel transistor MN12 has a drain/source receiving the first control signal $S_{11}$, and a gate receiving the high voltage $V_D$. The current source 141 has a first terminal receiving the high voltage $V_D$, and a second terminal electrically connected to a source/drain of the N channel transistor MN12 and the second output stage 130. Moreover, the P channel transistor MP12 has a drain/source receiving the second control signal $S_{12}$, and a gate receiving the low voltage $V_S$. The current source 151 has a first terminal receiving the low voltage $V_S$, and a second terminal electrically connected to a source/drain of the P channel transistor MP12 and the second output stage 130.

In a transistor design, a threshold voltage of the N channel transistor MN12 is greater than an absolute value of a threshold voltage of the P channel transistor MP11. Therefore, when the P channel transistor MP11 is under static bias, even though the P channel transistor MP11 can be turned on, the N channel transistor MN12 is maintained in the turned off state. Similarly, the absolute value of the threshold voltage of the P channel transistor MP12 is greater than the threshold voltage of the N channel transistor MN11. Therefore, when the N channel transistor MN11 is under static bias, even though the N channel transistor MN11 can be turned on, the P channel transistor MP12 is maintained in the turned off state.

Furthermore, the second output stage 130 includes a P channel transistor MP13 and an N channel transistor MN13. The P channel transistor MP13 has a source receiving the high voltage $V_D$, a gate electrically connected to the first control stage 140, and a drain electrically connected to the output terminal TM11 of the output buffer 100. Moreover, the N channel transistor MN13 has a drain electrically connected to the drain of the P channel transistor MP13, a gate electrically connected to the second control stage 150, and a source receiving the low voltage $V_S$.

In a general operation, when the input signal $V_{IN}$ is equal to the feedback signal $V_{OUT}$, the differential amplifier respectively maintains the first control signal $S_{11}$ and the second control signal $S_{12}$ at different bias levels, so the P channel transistor MP11 and the N channel transistor MN11 in the first output stage 120 are under static bias. According to this static bias design, the P channel transistor MP11 and the N channel transistor MN11 are in the weakly turned on state, and therefore the first output stage 120 cannot provide current to the output terminal TM11 of the output buffer 100.

Moreover, for the first control stage 140, since the threshold voltage of the N channel transistor MN12 is greater than the absolute value of the threshold voltage of the P channel transistor MP11, the N channel transistor MN12 cannot be turned on. Accordingly, the current source 141 charges a parasitic capacitor located at a node N11 to the high voltage $V_D$, so the first control stage 140 outputs the high voltage $V_D$ to the second output stage 130. Moreover, for the second control stage 150, since the absolute value of the threshold voltage of the P channel transistor MP12 is greater than the threshold voltage of the N channel transistor MN11, the P channel transistor MP12 cannot be turned on. Accordingly, the current source 151 charges a parasitic capacitor located at a node N12 to the low voltage $V_S$, so the second control stage 150 outputs the low voltage $V_S$ to the second output stage 130.

In other words, when the input signal $V_{IN}$ is equal to the feedback signal $V_{OUT}$, the first control stage 140 and the second control stage 150 respectively generates the high voltage $V_D$ and the low voltage $V_S$ to the second output stage 130. At this time, the gate of the P channel transistor MP13 in the second output stage 130 receives the high voltage $V_D$, and therefore the P channel transistor MP13 cannot be turned on. On the other hand, the gate of the N channel transistor MN13 in the second output stage 130 receives the low voltage $V_S$, and therefore the N channel transistor MN13 cannot be turned on.

It should be noted that, since the first control stage 140 is biased under the high voltage $V_D$, after the current source 141 boosts the voltage level of the node N11 to the high voltage $V_D$, the current source 141 automatically shuts off. Similarly, since the second control stage 150 is biased under the low voltage $V_S$, after the current source 151 lowers the voltage level of the node N12 to the low voltage $V_S$, the current source 151 automatically shuts off. In other words, when the input signal $V_{IN}$ is equal to the feedback signal $V_{OUT}$, the output buffer 100 is in the static state, hence the first control stage 140 and the second control stage 150 do not consume extra static current, and therefore the power consumption of the output buffer 100 is effectively lowered. Moreover, the circuit framework of the first control stage 140 and the second control stage 150 is compact, without the need for extra digital control circuits. Therefore, the system complexity and the layout area of the output buffer 100 can also be reduced.

In another aspect, when the input signal $V_{IN}$ is greater than the feedback signal $V_{OUT}$, this is, when the input signal $V_{IN}$ is in the process of being switched to the high voltage $V_D$, the differential amplifier 110 simultaneously lowers the voltage levels of the first control signal $S_{11}$ and the second control signal $S_{12}$. At this time, the P channel transistor MP11 in the first output stage 120 is turned on, and the N channel transistor MN11 is turned off. Accordingly, the first output stage 120 may push the first current to the terminal TM11 of the output buffer 100. On the other hand, the N channel transistor MN12 in the first control stage 140 is turned on, so the first control stage 140 outputs the first control signal $S_{11}$ having the low voltage level to the second output stage 130.

Moreover, the P channel transistor MP12 in the second control stage 150 is turned on, so the second control stage 150 outputs the second control signal $S_{12}$ having the low voltage level to the second output stage 130. Accordingly, the first control signal $S_{11}$ having the low voltage level turns on the P channel transistor MP13 in the second output stage 130, and the second control signal $S_{12}$ having the low voltage level turns off the N channel transistor MN13 in the second output stage 130. Therefore, the second output stage 130 may provide the second current to the output terminal TM11 of the output buffer 100, and thereby increase the driving ability of the output buffer 100.

In addition, when the input signal $V_{IN}$ is lower than the feedback signal $V_{OUT}$, this is, the input signal $V_{IN}$ is in the process of being switched to the low voltage $V_S$, the differential amplifier 110 simultaneously boosts the voltage levels of the first control signal $S_{11}$ and the second control signal $S_{12}$. At this time, the P channel transistor MP11 in the first output stage 120 is turned off, and the N channel transistor MN11 is turned on. Accordingly, the first output stage 120 may pull a first current from the terminal TM11 of the output buffer 100. On the other hand, the N channel transistor MN12 in the first control stage 140 is turned on, so the first control stage 140 outputs the first control signal $S_{11}$ having the high voltage level to the second output stage 130.

Moreover, the P channel transistor MP12 in the second control stage 150 is turned on, so the second control stage 150 outputs the second control signal $S_{12}$ having the high voltage level to the second output stage 130. Accordingly, the first control signal $S_{11}$ having the high voltage level turns off the P channel transistor MP13 in the second output stage 130, and the second control signal $S_{12}$ having the high voltage level turns on the N channel transistor MN13 in the second output stage 130. Therefore, the second output stage 130 may also provide current for pulling a second current from the output terminal TM11 of the output buffer 100.

In view of the foregoing, an embodiment of the invention employs the first control stage and the second control stage to control the second output stage, and employs the second output stage to increase the driving ability of the first output stage. Wherein, when the input signal transits, this is, when the input signal is in the process of being switched to the high voltage or the low voltage, the second output stage pushes or pulls the second current to increase the driving ability of the output buffer. The first control stage and the second control stage are respectively biased under the high voltage and the low voltage, therefore, when the output buffer is in the static state, the first control stage and the second control stage do not consume extra static current, and the power consumption of the output buffer is effectively lowered. Moreover, the first control stage and the second control stage do not require the need for extra digital control circuits. Therefore, the system complexity and the layout area of the output buffer can also be reduced.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. An output buffer, comprising:
   a differential amplifier receiving an input signal and a feedback signal from an output terminal of the output buffer and accordingly controlling a level of a first control signal and a second control signal;
   a first output stage biased between a high voltage and a low voltage, judging whether to provide a first current to the output terminal of the output buffer according to the level of the first control signal and the second control signal;
   a first control stage biased under the high voltage, outputting one of the first control signal and the high voltage according to the level of the first control signal;
   a second control stage biased under the low voltage, outputting one of the second control signal and the low voltage according to the level of the second control signal; and
   a second output stage biased between the high voltage and the low voltage, judging whether to provide a second current to the output terminal of the output buffer according to a signal generated by the first control stage and the second control stage.

2. The output buffer as claimed in claim 1, wherein the first output stage comprises:
   a first P channel transistor having a source receiving the high voltage, a gate receiving the first control signal, and a drain electrically connected to the output terminal of the output buffer; and
   a first N channel transistor having a drain electrically connected to the drain of the first P channel transistor, a gate receiving the second control signal, and a source receiving the low voltage,
   wherein, when the input signal is not equal to the feedback signal, one of the first P channel transistor and the first N channel transistor is turned on, when the input signal is equal to the feedback signal, the first P channel transistor and the first N channel transistor are both turned on.

3. The output buffer as claimed in claim 2, wherein the first control stage comprises:
   a second N channel transistor having a drain/source receiving the first control signal, and a gate receiving the high voltage; and
   a first current source having a first terminal receiving the high voltage, a second terminal electrically connected to a source/drain of the second N channel transistor and the second output stage, wherein, when the input signal is greater than the feedback signal, the first P channel transistor and the second N channel transistor are both turned on, when the input signal equals the feedback signal, the first P channel transistor is turned on, and the second N channel transistor is turned off.

4. The output buffer as claimed in claim 3, wherein a threshold voltage of the second N channel transistor is greater than an absolute value of a threshold voltage of the first P channel transistor.

5. The output buffer as claimed in claim 2, wherein the second control stage comprises:
- a second P channel transistor having a drain/source receiving the second control signal, and a gate receiving the low voltage; and
- a second current source having a first terminal receiving the low voltage electrically connected to a source/drain of the second P channel transistor, a second terminal electrically connected to a source/drain of the second P channel transistor and the second output stage, wherein, when the input signal is lower than the feedback signal, the first N channel transistor and the second P channel transistor are both turned on, when the input signal equals the feedback signal, the first N channel transistor is turned on, and the second P channel transistor is turned off.

6. The output buffer as claimed in claim 5, wherein an absolute value of a threshold voltage of the second P channel transistor is greater than a threshold voltage of the first N channel transistor.

7. The output buffer as claimed in claim 1, wherein the second output stage comprises:
- a third P channel transistor having a source receiving the high voltage, a gate electrically connected to the first control stage, and a drain electrically connected to the output terminal of the output buffer; and
- a third N channel transistor having a drain electrically connected to the drain of the third P channel transistor, a gate electrically connected to the second control stage, and a source receiving the low voltage.

* * * * *